(12) United States Patent
Hirose et al.

(10) Patent No.: US 7,238,970 B2
(45) Date of Patent: Jul. 3, 2007

(54) SEMICONDUCTOR DEVICE AND METHOD FOR FABRICATING THE SAME

(75) Inventors: Yutaka Hirose, Kyoto (JP); Tsuyoshi Tanaka, Osaka (JP); Yasuhiro Uemoto, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 142 days.

(21) Appl. No.: 10/971,098

(22) Filed: Oct. 25, 2004

(65) Prior Publication Data

US 2005/0093098 A1    May 5, 2005

(30) Foreign Application Priority Data

Oct. 30, 2003   (JP)   ............... 2003-370407

(51) Int. Cl.
*H01L 29/732*   (2006.01)
(52) U.S. Cl. ............... 257/183; 257/E29.143
(58) Field of Classification Search ........... 257/183
See application file for complete search history.

(56) References Cited

U.S. PATENT DOCUMENTS 5,422,500 A * 6/1995 Tomikawa et al. ............ 257/76

2002/0113249 A1 * 8/2002 Hori et al. ................ 257/194

FOREIGN PATENT DOCUMENTS

| JP | 2-275682 | 11/1990 |
|---|---|---|
| JP | 2-288371 | 11/1990 |
| JP | 10-242514 | 9/1998 |
| JP | 10-242515 | 9/1998 |
| JP | 10-247761 | 9/1998 |
| JP | 10-261815 | 9/1998 |
| JP | 11-126947 | 5/1999 |
| JP | 2000-252230 | 9/2000 |
| JP | 2003-101038 | 4/2003 |
| JP | 2004-146424 | 5/2004 |

* cited by examiner

*Primary Examiner*—B. William Baumeister
*Assistant Examiner*—Matthew L. Reames
(74) *Attorney, Agent, or Firm*—McDermott Will & Emery LLP

(57) ABSTRACT

A semiconductor device of the present invention comprises a Group III-V nitride semiconductor layer of gallium nitride or the like having n-type conductivity and at least one ohmic electrode formed on the Group III-V nitride semiconductor layer of gallium nitride or the like having n-type conductivity. The ohmic electrode is formed of a conductive material containing a metal boride.

7 Claims, 6 Drawing Sheets

SEMICONDUCTOR DEVICE AND METHOD FOR FABRICATING THE SAME

CROSS-REFERENCE TO RELATED APPLICATIONS

The disclosure of Japanese Patent Application No. 2003-370407 filed on Oct. 30, 2003 including specification, drawings and claims is incorporated herein by reference in its entirety.

BACKGROUND OF THE INVENTION (1) Field of the Invention

The present invention relates to a semiconductor device using a Group III-V nitride compound semiconductor and a method for fabricating the same.

(2) Description of Related Art

Compounds made of Group III elements, boron (B), aluminum (Al), gallium (Ga) and indium (In), and a Group V element, nitride (N) and represented by the general formula, $B_wAl_xGa_yIn_zN$ (wherein w+x+y+z=1 and $0 \leq w, x, y, z \leq 1$) are Group III-V nitride compound semiconductors, i.e., the so-called Group III-V nitride semiconductors. Group III-V nitride semiconductors have advantages such as wide band gaps and associated high breakdown voltages, high electron saturation velocities and high mobilities, and also high electron densities in heterojunctions. In view of the above, Group III-V nitride semiconductors are being researched and developed for the purpose of applying them to short-wavelength light-emitting elements, high-power and high-frequency elements, high-frequency and low-noise amplifying elements, or the like.

In order to enhance characteristics of semiconductor elements made of such Group III-V nitride semiconductors, it is necessary to maximally reduce the contact resistance of each semiconductor element. When current is carried by electrons, an ohmic electrode need be formed from outside in the region where electrons are conducted (hereinafter, referred to as an "electron channel"). In this case, it is especially significant to reduce the contact resistance of the ohmic contact.

A known method for forming an ohmic electrode (see, for example, Japanese Unexamined Patent Publication No. 11-126947) will be described hereinafter.

FIGS. 8A and 8B show the most typical method for forming an ohmic electrode in an n-type electron channel. As shown in FIG. 8A, an n-type aluminum gallium nitride ($Al_xGa_{1-x}N$: $0 \leq x \leq 1$) layer 32 serving as an active layer is formed on a sapphire substrate 31. A multilayer metal thin film 33 is formed on the $Al_xGa_{1-x}N$ layer 32 by lift-off to include titanium (Ti) as the lowest layer and aluminum (Al), nickel (Ni), gold (Au), and the like thereon. Next, annealing is performed at a high temperature (500° C. through 900° C.). In this way, as shown in FIG. 8B, Ti of the multilayer metal thin film 33 is allowed to react with nitrogen (N) of the $Al_xGa_{1-x}N$ layer 32 to form vacancies of nitrogen (N), thereby forming a region 34 with an increased metallicity in the vicinity of the top surface of the $Al_xGa_{1-x}N$ layer 32. At the same time, Ga, Ti, TiN, Al, Ni, Au, and the like existing at the interface between the region 34 and the multilayer metal thin film 33 are allowed to react with one another to form a stable metal compound serving as an ohmic electrode.

With this method, the tunnel effect at the interface between the electron channel and an electrode metal is increased so that the contact resistance of the ohmic electrode can be reduced. For example, when source/drain electrodes of a typical heterojunction transistor obtained by stacking a 25-nm-thick $Al_{0.25}Ga_{0.75}N$ layer and GaN are formed by this method, an ohmic electrode having a contact resistance of approximately $1 \times 10^{-5}$ $\Omega \cdot cm^2$ can be formed.

As the other method for forming an electrode in a Group III-V nitride semiconductor, a method using metal diboride is known which is intended to improve the lattice match between a Group III-V nitride semiconductor layer and an electrode (see, for example, Japanese Unexamined Patent Publication No. 2003-101038).

However, a contact resistance of the order of $10^{-6}$ through $10^{-7}$ $\Omega \cdot cm^2$ is demanded for ohmic electrodes of practical high-frequency devices. The ohmic electrodes obtained by the known method for forming an ohmic electrode cannot satisfy this demand.

Since in the known example nitrogen vacancies are produced in a Group III-V nitride semiconductor layer to increase the tunnel effect at the interface between an electrode metal and a nitride semiconductor layer, this reduces the contact resistance of an ohmic electrode. In this relation, the lower limit of the contact resistance is defined by the height of a potential barrier located at the interface between a metal used for an ohmic contact and an electron-conducting channel, i.e., the barrier height.

The barrier height at the interface is determined by the work function of a metal used for an electrode. The work function represents the height from the Fermi level to the vacuum level. The work function of Ti usually used for electrodes in $n^-$-type nitride semiconductors is approximately 5 eV. Accordingly, even when the tunnel effect is increased to reduce the contact resistance, it is extremely difficult to achieve a required contact resistance of the order of $10^{-6}$ through $10^{-7}$ $\Omega \cdot cm^2$.

The present invention is made to solve the conventional problems, and its object is to realize a semiconductor device made of a Group III-V nitride semiconductor comprising a low-resistance ohmic electrode.

SUMMARY OF THE INVENTION

In order to achieve the above object, a semiconductor device of the present invention comprises an ohmic electrode containing a metal boride.

To be specific, the semiconductor device of the present invention is directed to a semiconductor device comprising: a Group III-V nitride semiconductor layer having n-type conductivity; and at least one ohmic electrode formed on the Group III-V nitride semiconductor layer, wherein the ohmic electrode is made of a conductive material containing a metal boride.

According to the semiconductor device of the present invention, the barrier height between the Group III-V nitride semiconductor layer and the ohmic electrode can be made close to 0. This can significantly reduce the contact resistance.

In the semiconductor device of the present invention, the metal boride is preferably one selected from the group consisting of $HfB_2$, $ZrB_2$, $LaB_6$, $CeB_6$, $YB_4$, and $GdB_4$, or a laminate of at least two selected from the group. Furthermore, the metal boride preferably comes into contact with the top surface of the Group III-V nitride semiconductor layer. Thus, the contact resistance can certainly be reduced.

The semiconductor device of the present invention preferably further comprises a metal oxide film formed between the Group III-V nitride semiconductor layer and the ohmic electrode. This facilitates the emission of electrons between the ohmic electrode made of a metal boride and the Group III-V nitride semiconductor layer, resulting in further reduced contact resistance.

In this case, the metal oxide film is preferably formed of an oxide of one selected from the group consisting of magnesium, calcium, barium, and strontium, or an oxide of an alloy made of at least two selected from the group. Furthermore, the metal oxide film preferably has a thickness of 1 nm through 10 nm both inclusive. Such a structure facilitates the emission of electrons from the ohmic electrode.

In the semiconductor device of the present invention, it is preferable that a heterojunction interface is formed below the Group III-V nitride semiconductor layer having n-type conductivity, the ohmic electrode is composed of two electrodes formed with a space interposed therebetween, the two electrodes are source/drain electrodes, a gate electrode is formed between the source and drain electrodes, said gate electrode controlling a current flowing between the source and drain electrodes, and the semiconductor device serves as a field-effect transistor. With this structure, the source/drain resistances can be reduced, leading to reduced on-resistance. As a result, a field-effect transistor with an excellent high-frequency characteristic and excellent transconductance can certainly be realized.

In the semiconductor device of the present invention, it is preferable that the Group III-V nitride semiconductor layer having n-type conductivity is composed of two layers that are a collector layer and an emitter layer, a base layer is formed between the collector layer and the emitter layer, said base layer being a Group III-V nitride semiconductor layer having p-type conductivity, and an NPN junction is formed of the collector layer, the base layer and the emitter layer, the ohmic electrode formed on a predetermined region of the top surface of the collector layer is a collector electrode, the ohmic electrode formed on a predetermined region of the top surface of the emitter layer is an emitter electrode, and the semiconductor device serves as a bipolar transistor. With this structure, the collector and emitter resistances can be reduced, leading to reduced on-resistance. As a result, a high-gain bipolar transistor with an excellent high-frequency characteristic can certainly be realized.

In the semiconductor device of the present invention, it is preferable that the Group III-V nitride semiconductor layer having n-type conductivity is an n-type contact layer, the ohmic electrode is an n-side electrode and the semiconductor device further comprises an n-type cladding layer formed in contact with the n-type contact layer, an active layer, p-type cladding layer and p-type contact layer successively formed on the n-type cladding layer, and a p-side electrode formed in contact with the p-type contact layer and serves as a semiconductor light emitting element.

Therefore, the resistance of the n-side electrode can be reduced, leading to reduced threshold voltage. As a result, a high-efficiency semiconductor light emitting element can be realized.

A method for fabricating a semiconductor device according to a first aspect of the present invention comprises the steps of: forming a Group III-V nitride semiconductor layer having n-type conductivity on a substrate; selectively forming a nitrogen-deficient region where nitrogen atoms are missing at the top surface of the Group III-V nitride semiconductor layer; and forming an ohmic electrode made of a metal boride on the nitrogen-deficient region.

According to the semiconductor device fabricating method of the first aspect of the present invention, a boron (B)-nitrogen (N) compound can be prevented from being formed between the Group III-V nitride semiconductor layer and the ohmic electrode. Therefore, the increase in the contact resistance due to the B—N compound does not arise, so that the ohmic electrode can exhibit the characteristics of a metal boride with a small work function. As a result, a semiconductor device comprising a low-resistance ohmic electrode can easily be obtained.

In the semiconductor device fabricating method of the first aspect of the present invention, the nitrogen-deficient region is preferably formed by annealing the Group III-V nitride semiconductor layer in a non-oxidizing atmosphere. With this structure, the nitrogen-deficient region can certainly be formed.

In this case, the non-oxidizing atmosphere is preferably an atmosphere of a single element gas selected from the group of nitrogen, hydrogen and a rare gas or a mixed gas containing at least two selected from the group. Furthermore, the annealing is preferably carried out at a temperature of 200° C. through 1200° C. both inclusive.

Therefore, the nitrogen-deficient region can certainly be formed without causing damage to the Group III-V nitride semiconductor layer.

In the semiconductor device fabricating method of the first aspect of the present invention, the nitrogen-deficient region may be formed by processing the surface of the Group III-V nitride semiconductor layer by any one of ion beam irradiation, electron beam irradiation, etching using an argon gas, plasma ashing, and dry etching. Even with this structure, the nitrogen-deficient region can be formed.

A method for fabricating a semiconductor device according to a second aspect of the present invention comprises the steps of: forming a Group III-V nitride semiconductor layer having n-type conductivity on a substrate; selectively forming a metal oxide film on the top surface of the Group III-V nitride semiconductor layer; and forming an ohmic electrode made of a metal boride on the metal oxide film.

According to the semiconductor device fabricating method of the second aspect of the present invention, the ohmic electrode can be formed on the metal oxide film facilitating the emission of electrons between the metal boride and the Group III-V nitride semiconductor layer. Furthermore, the metal boride does not come in direct contact with the Group III-V nitride semiconductor layer, and thus no B—N compound is formed. Therefore, a semiconductor device comprising a low-resistance ohmic electrode can easily be obtained.

In the semiconductor device fabricating method of the second aspect of the present invention, the step of forming the metal oxide film preferably includes the steps of: depositing a metal thin film that is formed of one selected from the group consisting of magnesium, calcium, barium, and strontium, or an alloy made of at least two selected from the group; and oxidizing the metal thin film.

With this structure, a metal oxide film with a very small work function can certainly be formed.

In this case, the step of oxidizing the metal oxide film preferably comprises the step of processing the metal thin film at a temperature between room temperature and 1200° C. both inclusive. With this structure, the metal oxide film can certainly be formed without causing damage to the Group III-V nitride semiconductor layer. Furthermore, the metal thin film preferably has a thickness of 1 nm through 10 nm both inclusive.

In the semiconductor device fabricating method of the present invention, the metal boride is preferably one selected from the group consisting of $HfB_2$, $ZrB_2$, $LaB_6$, $CeB_6$, $YB_4$, and $GdB_4$ or a laminate of at least two selected from the group. Furthermore, the metal boride is preferably formed by vacuum evaporation. In this way, a low-resistance ohmic electrode can certainly be formed.

According to the semiconductor device and the method for fabricating the same of the present invention, a Group III-V nitride semiconductor device comprising a low-resistance ohmic electrode can be realized.

DETAILED DESCRIPTION OF THE INVENTION

Embodiment 1

A semiconductor device according to a first embodiment of the present invention will be described with reference to FIGS. 1A through 1C.

Figure 1A:
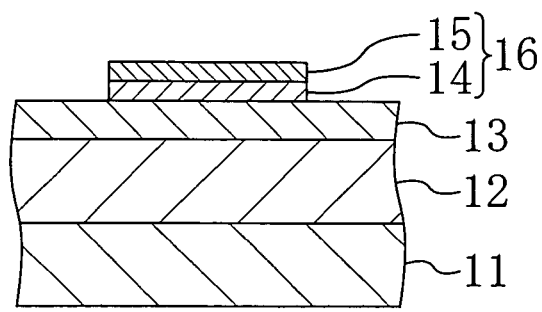
FIG. 1A is a cross-sectional view showing the principal part of a semiconductor device according to a first embodiment of the present invention.

FIG. 1A shows the cross-sectional structure of the principal part of the semiconductor device of this embodiment. As shown in FIG. 1A, a gallium nitride (GaN) layer 12 is formed on a substrate 11 made of sapphire, and a 25-nm-thick n-type aluminum gallium nitride ($Al_{0.25}Ga_{0.75}N$) layer 13 is formed, as an n-type Group III-V nitride semiconductor layer, on the GaN layer 12. A multilayer electrode 16 is formed on the $Al_{0.25}Ga_{0.75}N$ layer 13. The multilayer electrode 16 is an ohmic electrode including a 200-nm-thick lanthanum hexaboride ($LaB_6$) layer 14 as the lower layer and a 200-nm-thick aluminum (Al) layer as the upper layer.

Figure 2A:
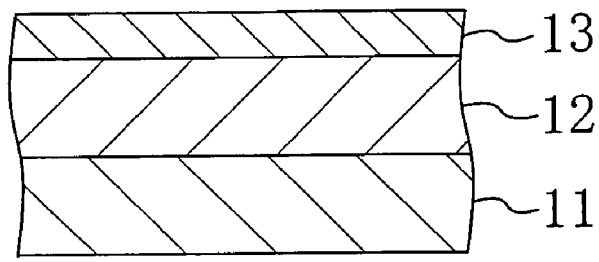
FIGS. 2A through 2C are cross-sectional views showing process steps in a method for fabricating the principal part of a semiconductor device according to the first embodiment of the present invention step by step.
Figure 2B:
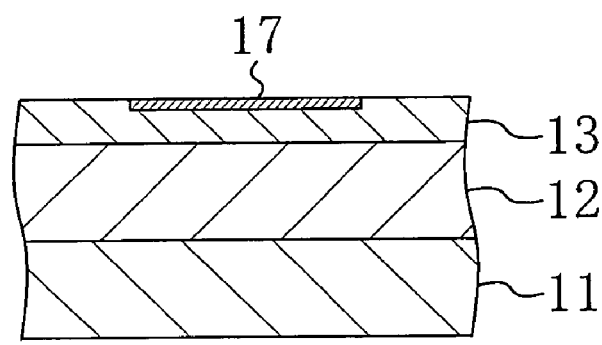
Figure 2C:
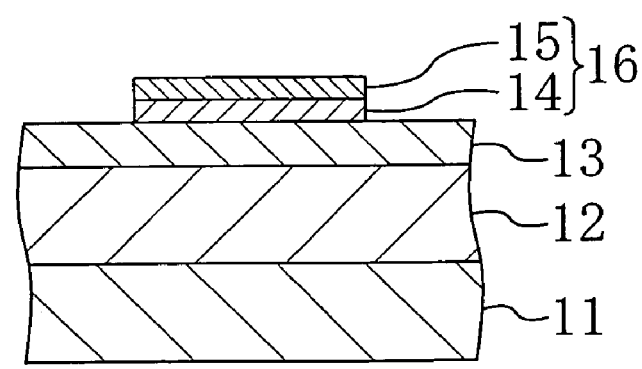

A method for fabricating an ohmic electrode part of the semiconductor device of this embodiment will be described hereinafter with reference to FIGS. 2A through 2C. FIGS. 2A through 2C show cross-sectional structures of the semiconductor device in process steps of the method for fabricating the ohmic electrode part of the semiconductor device of this embodiment step by step.

As shown in FIG. 2A, a 250-nm-thick GaN layer 12 is first deposited on a substrate 11 made of sapphire by metal organic chemical vapor deposition. Subsequently, a 25-nm-thick n-type $Al_{0.25}Ga_{0.75}N$ layer 13 is deposited on the GaN layer 12 by metal organic chemical vapor deposition.

Next, as shown in FIG. 2B, the substrate 11 on which the GaN layer 12 and the $Al_{0.25}Ga_{0.75}N$ layer 13 are successively formed is annealed in a nitrogen atmosphere at a temperature of 900° C. for five minutes, thereby selectively forming a nitrogen-deficient region 17 where nitrogen atoms are missing in the vicinity of the surface of the $Al_{0.25}Ga_{0.75}N$ layer 13.

Next, as shown in FIG. 2C, a 200-nm-thick $LaB_6$ layer 14 and a 200-nm-thick Al layer 15 are successively formed on the nitrogen-deficient region 17 by vacuum evaporation.

In this way, since before the formation of the $LaB_6$ layer 14 the nitrogen-deficient region 17 is formed in the vicinity of the surface of the $Al_{0.25}Ga_{0.75}N$ layer 13, this can prevent boron (B) and nitrogen (N) from forming a compound containing boron and nitrogen, i.e., a B—N compound, at the interface between the $Al_{0.25}Ga_{0.75}N$ layer 13 and $LaB_6$ layer 14. This can further reduce the contact resistance at the interface between the $Al_{0.25}Ga_{0.75}N$ layer 13 and the $LaB_6$ layer 14.

Figure 1B:
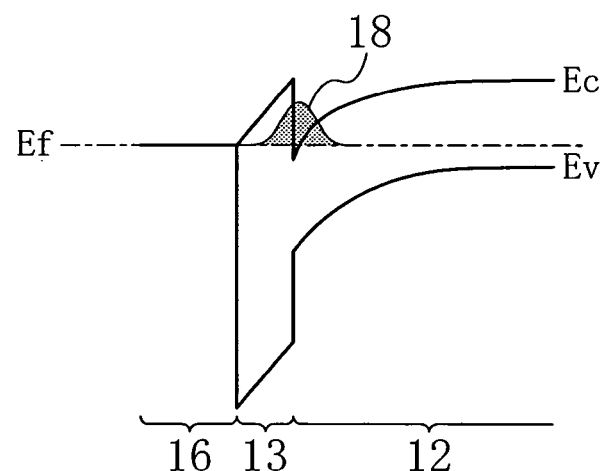
FIG. 1B is an energy diagram of the semiconductor device according to the first embodiment of the present invention.

FIG. 1B is an energy diagram of the structure of the semiconductor device of this embodiment. A two-dimensional electron gas is formed with an electron density of $1\times10^{13}/cm^2$ at the interface between the GaN layer 12 and the $Al_{0.25}Ga_{0.75}N$ layer 13 due to a difference in polarization between GaN and $Al_{0.25}Ga_{0.75}N$. This two-dimensional electron gas allows the multilayer electrode 16 to form ohmic contact with the $Al_{0.25}Ga_{0.75}N$ layer 13.

The work function of the $LaB_6$ layer 14 deposited on the $Al_{0.25}Ga_{0.75}N$ layer 13 is 2.7 eV. That is, it is about 2 eV lower than that of Ti conventionally used for an electrode. The Fermi level of the $LaB_6$ layer 14 substantially coincides with the lower end of the conduction band of the $Al_{0.25}Ga_{0.75}N$ layer 13. Accordingly, the barrier height defining the lower limit of the contact resistance can be substantially 0 at the $LaB_6/Al_{0.25}Ga_{0.75}N$ interface.

Figure 1C:
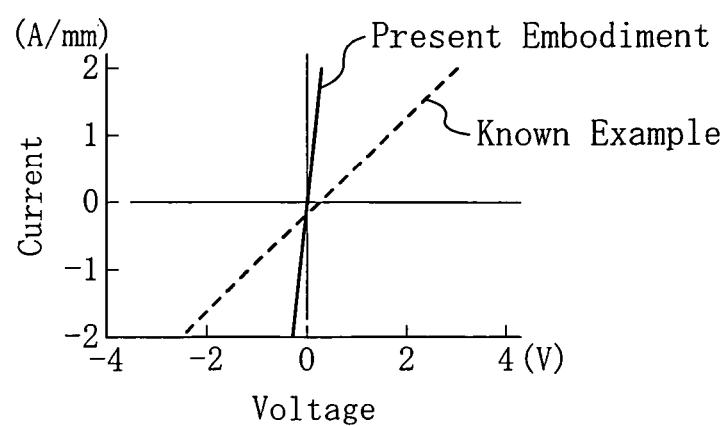
FIG. 1C is a graph showing the comparison of the I-V characteristics between the semiconductor device according to the first embodiment of the present invention and a known semiconductor device.

FIG. 1C shows the comparison of the current-voltage (I-V) characteristics between the semiconductor device according to the first embodiment of the present invention and a known semiconductor device. As obvious from FIG. 1C, the I-V characteristic curve of the semiconductor device of the present invention has a larger gradient than that of the known semiconductor device, and the semiconductor device of the present invention has a contact resistance of $1\times10^{-6}$ $\Omega \cdot cm^2$ while the known semiconductor device has a contact resistance of $1\times10^{-5}$ $\Omega \cdot cm^2$. That is, the contact resistance of the semiconductor device of the present invention is reduced to about one-tenth of that of the known semiconductor device. A semiconductor device having a multilayer electrode including Ti as the lower layer and Al as the upper layer is used as the known semiconductor device.

Although in this embodiment the step of forming the nitrogen-deficient region 17 in the vicinity of the surface of the $Al_{0.25}Ga_{0.75}N$ layer 13 is carried out in a nitrogen atmosphere, the nitrogen-deficient region 17 may be formed in an atmosphere containing no oxygen ($O_2$). It is preferably formed in an atmosphere containing a rare gas such as nitrogen ($N_2$), hydrogen ($H_2$), argon (Ar), or neon (Ne) or an atmosphere containing mixtures of these gases.

It need be processed at a temperature of 200° C. or more. In this case, it is preferably processed at a temperature of 1200° C. or less to prevent damage to the semiconductor layer.

Furthermore, the similar effects can be obtained by, instead of annealing, a process, such as ion beam irradiation, electron beam irradiation, plasma ashing, or dry etching, on the surface of the $Al_{0.25}Ga_{0.75}N$ layer 13. Ar is preferably used as a plasma species during dry etching.

Although in this embodiment an electrode is formed of a laminate of $LaB_6$ and Al, $HfB_2$, $ZrB_2$, $CeB_6$, $YB_4$, or $GdB_4$ that is also a boride compound may be used instead of $LaB_6$. Furthermore, a laminate made of a plurality of compounds selected from the group of the above compounds may be used. Alternatively, a low-resistance metal such as Au, Ni or Cu can be used as the upper layer instead of Al. Furthermore, a laminate or compound made of the above metals may be used.

Although in this embodiment the n-type $Al_{0.25}Ga_{0.75}N$ layer is used as an n-type Group III-V nitride semiconductor layer, one obtained by doping an arbitrary compound selected from compounds represented by the general formula, $B_wAl_xGa_yIn_zN$, wherein $w+x+y+z=1$; and $0 \leq w, x, y, z \leq 1$, with n-type impurities can be used.

Embodiment 2

A semiconductor device of a second embodiment of the present invention will be described hereinafter with reference to FIGS. 3A through 3C.

Figure 3A:
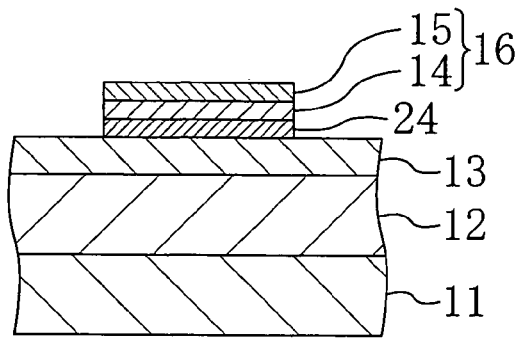
FIG. 3A is a cross-sectional view showing the principal part of a semiconductor device according to a second embodiment of the present invention.

FIG. 3A shows the cross-sectional structure of the principal part of the semiconductor device of the second embodiment. As shown in FIG. 3A, a GaN layer 12 is formed on a substrate 11 made of sapphire, and a 25-nm-thick n-type $Al_{0.25}Ga_{0.75}N$ layer 13 is formed, as an n-type Group III-V nitride semiconductor layer, on the GaN layer 12. In this embodiment, a 3-nm-thick metal oxide film 24 of strontium oxide (SrO) is formed on the $Al_{0.25}Ga_{0.75}N$ layer 13. A 200-nm-thick $LaB_6$ layer 14 and a 200-nm-thick Al layer 15 are successively stacked on the metal oxide film 24 in bottom-to-top order, thereby forming a multilayer electrode 16 serving as an ohmic electrode.

A method for fabricating an ohmic electrode part of the semiconductor device of this embodiment will be described hereinafter with reference to FIGS. 4A through 4D. FIGS. 4A through 4D show cross-sectional structures of the semiconductor device in process steps of the method for fabricating the ohmic electrode part of the semiconductor device of this embodiment step by step.

Figure 4A:
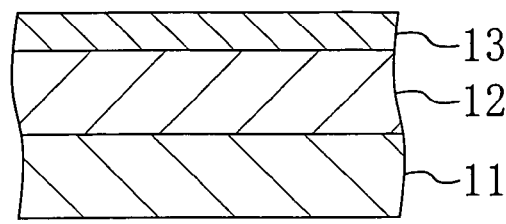
FIGS. 4A through 4D are cross-sectional views showing process steps in a method for fabricating the principal part of a semiconductor device according to a third embodiment of the present invention step by step.

As shown in FIG. 4A, first, a GaN layer 12 and an n-type $Al_{0.25}Ga_{0.75}N$ layer 13 are successively formed on the substrate 11 made of sapphire.

Figure 4B:
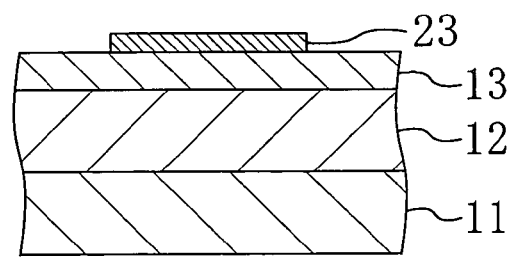
Figure 4C:
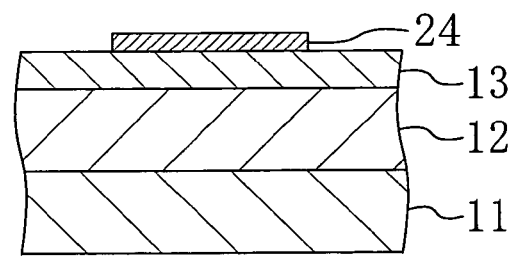

Next, as shown in FIG. 4B, a 2-nm-thick metal thin film 23 of strontium (Sr) is formed on the n-type $Al_{0.25}Ga_{0.75}N$ layer 13 by vacuum evaporation. Furthermore, as shown in FIG. 4C, the metal thin film 23 is processed in a 100% oxygen atmosphere at a temperature of 100° C. for ten minutes, thereby forming a 3-nm-thick metal oxide film 24 of SrO.

Figure 4D:
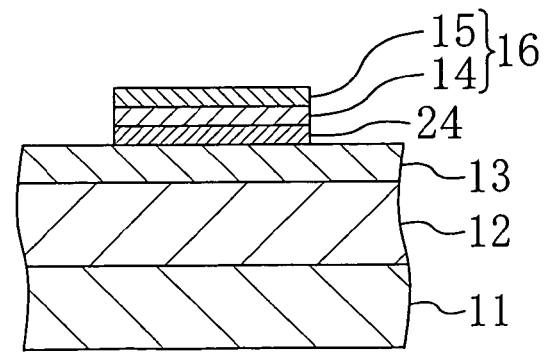

Next, as shown in FIG. 4D, a 200-nm-thick $LaB_6$ layer 14 and a 200-nm-thick Al layer 15 are successively formed by vacuum evaporation, thereby forming a multilayer electrode 16.

Figure 3B:
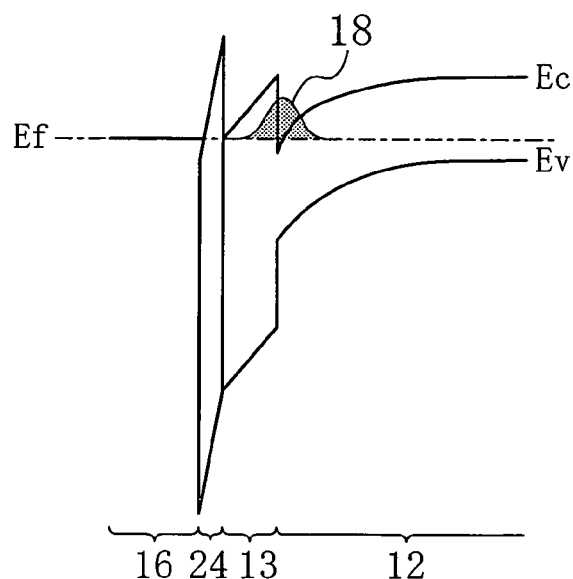
FIG. 3B is an energy diagram of the semiconductor device according to the second embodiment of the present invention.

FIG. 3B is an energy diagram of the structure of the semiconductor device of this embodiment. A two-dimensional electron gas is formed with an electron density of $1 \times 10^{13}/cm^2$ at the interface between the GaN layer 12 and the $Al_{0.25}Ga_{0.75}N$ layer 13 due to the difference in polarization between the GaN layer 12 and the $Al_{0.25}Ga_{0.75}N$ layer 13. This two-dimensional electron gas allows the multilayer electrode 16 to form ohmic contact with the $Al_{0.25}Ga_{0.75}N$ layer 13.

In this embodiment, a 3-nm-thick metal oxide film 24 of SrO is formed between the $Al_{0.25}Ga_{0.75}N$ layer 13 and the $LaB_6$ layer 14. SrO is an insulative oxide having an extremely low work function of 1.25 eV and facilitates the emission of electrons from the $LaB_6$ layer 14 to the $Al_{0.25}Ga_{0.75}N$ layer 13. In addition, the $LaB_6$ layer 14 does not come into direct contact with the $Al_{0.25}Ga_{0.75}N$ layer 13, and thus a B—N compound is not formed which increases the contact resistance at the interface between the $LaB_6$ layer 14 and the $Al_{0.25}Ga_{0.75}N$ layer 13. Therefore, unlike the first embodiment, the step of forming a nitrogen-deficient region is unnecessary.

Figure 3C:
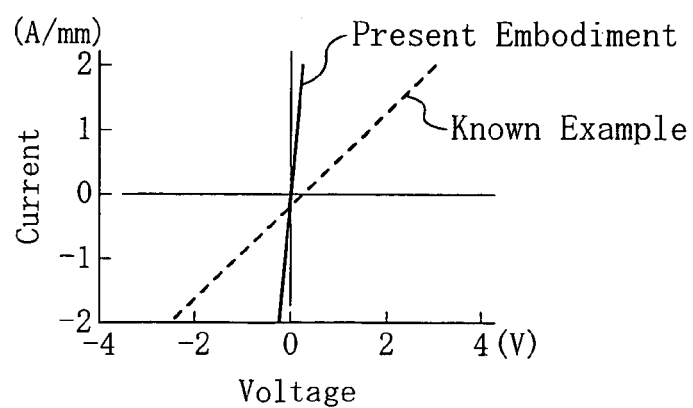
FIG. 3C is a graph showing the comparison of the I-V characteristics between the semiconductor device according to the second embodiment of the present invention and the known semiconductor device.

FIG. 3C shows the comparison of the current-voltage (I-V) characteristics between the semiconductor device according to this embodiment of the present invention and a known semiconductor device. As obvious from FIG. 3C, the I-V characteristic curve of the semiconductor device of the present invention has a larger gradient than that of the known semiconductor device. The semiconductor device of the present invention has a contact resistance of $5 \times 10^{-7}$ $\Omega \cdot cm^2$ while the known semiconductor device has a contact resistance of $1 \times 10^{-5}$ $\Omega \cdot cm^2$. That is, the contact resistance of the semiconductor device of the present invention is reduced to about one-twentieth of that of the known semiconductor device. A semiconductor device having a multilayer electrode including Ti as the lower layer and Al as the upper layer is used as the known semiconductor device.

In this embodiment, the metal oxide film 24 has a thickness of 3 nm. In order to allow a sufficient tunnel current to flow between the $LaB_6$ layer 14 and the $Al_{0.25}Ga_{0.75}N$ layer 13, the metal oxide film 24 preferably has a thickness of 10 nm or less. Furthermore, in order to facilitate the emission of electrons from the $LaB_6$ layer 14 and prevent the formation of the B—N compound, it preferably has a thickness of 1 nm or more.

An insulative metal oxide with a low work function can be used for the metal oxide film 24. The similar effects can be obtained even if an oxide of any one of strontium (Sr), magnesium (Mg), calcium (Ca), and barium (Ba) or an oxide of an alloy of these metals is used therefor.

In this embodiment, the metal oxide film 24 is formed by processing the deposited metal thin film in an oxygen atmosphere. The oxygen concentration in this case need be 3% or more. Since the reaction proceeds even at room temperature, the annealing temperature is not particularly limited. However, the metal thin film is preferably processed at a temperature of 1200° C. or less to prevent damage to the semiconductor layer. Alternatively, the metal thin film may be turned into a metal oxide film 24 by plasma oxidation.

Furthermore, although in this embodiment the metal thin film 23 is deposited on the $Al_{0.25}Ga_{0.75}N$ layer 13 and then subjected to oxidation to form the metal oxide film 24, the metal oxide film 24 may be formed directly on the $Al_{0.25}Ga_{0.75}N$ layer 13 by sputtering or reactive sputtering.

As in the first embodiment, $HfB_2$, $ZrB_2$, $CeB_6$, $YB_4$, or $GdB_4$ may be used instead of $LaB_6$. Alternatively, a laminate of the above compounds may be used.

Embodiment 3

A semiconductor device of a third embodiment of the present invention will be described hereinafter with reference to FIG. 5. The semiconductor device of this embodiment is a field-effect transistor (FET). In this embodiment, the ohmic electrode of the first embodiment is used as source/drain electrodes.

Figure 5:
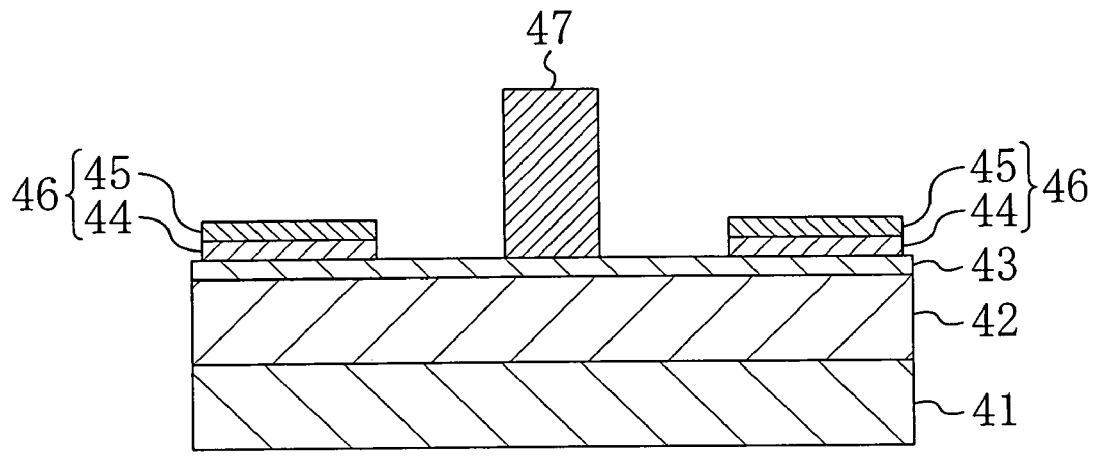
FIG. 5 is a cross-sectional view showing the semiconductor device according to the third embodiment of the present invention.

FIG. 5 shows the cross-sectional structure of the semiconductor device of this embodiment. As shown in FIG. 5, an operating layer 42 made of GaN is formed on a substrate 41 made of sapphire, and a 25-nm-thick barrier layer 43 made of n-type $Al_{0.25}Ga_{0.75}N$ is formed on the operating layer 42. Two multilayer electrodes 46 serving as source/drain electrodes are formed on the barrier layer 43 with a predetermined space interposed therebetween. As in the first embodiment, each multilayer electrode 46 is obtained by stacking a 200-nm-thick $LaB_6$ layer 44 as the lower layer and a 200-nm-thick Al layer 45 as the upper layer. A gate electrode 47 of an alloy of palladium (pd) and silicon (Si) is formed on the top surface of the barrier layer 43 between the source/drain electrodes.

An example of a method for fabricating a semiconductor device of this embodiment will be described hereinafter. First, an operating layer 42 made of GaN and a barrier layer 43 made of $Al_{0.25}Ga_{0.75}N$ are epitaxially grown on a substrate 41 made of sapphire. Next, a conductive layer obtained by stacking a $LaB_6$ layer 44 and an Al layer 45 is formed on the barrier layer 43 by the method of the first embodiment. Subsequently, the conductive layer is patterned to remove a predetermined part of the conductive layer, thereby forming two multilayer electrodes 46 serving as source/drain electrodes. Furthermore, a gate electrode 47 made of an alloy of Pd and Si is formed on the top surface of the barrier layer 43 between the source/drain electrodes.

Since in the semiconductor device of this embodiment the multilayer electrodes containing $LaB_6$ is used as the source/drain electrodes, this can reduce the ohmic resistance of the source/drain electrodes, leading to the reduced source/drain resistances. Furthermore, this reduces the on-resistance to obtain a FET having an excellent high-frequency characteristic and a large transconductance.

Although in this embodiment each multilayer electrode has the same structure as that of the first embodiment, it may include a metal oxide film as in the second embodiment. Alternatively, other boride compounds may be used instead of $LaB_6$. As long as the semiconductor device of this embodiment serves as a FET, the thickness of each layer, the material of the substrate, the composition between the operating layer and the barrier layer, and the material of the gate electrode, or the like may be changed.

Embodiment 4

A semiconductor device of a fourth embodiment of the present invention will be described hereinafter with reference to FIG. 6. The semiconductor device of this embodiment is a heterojunction bipolar transistor (HBT). In this embodiment, the ohmic electrode of the first embodiment is used as collector and emitter electrodes.

Figure 6:
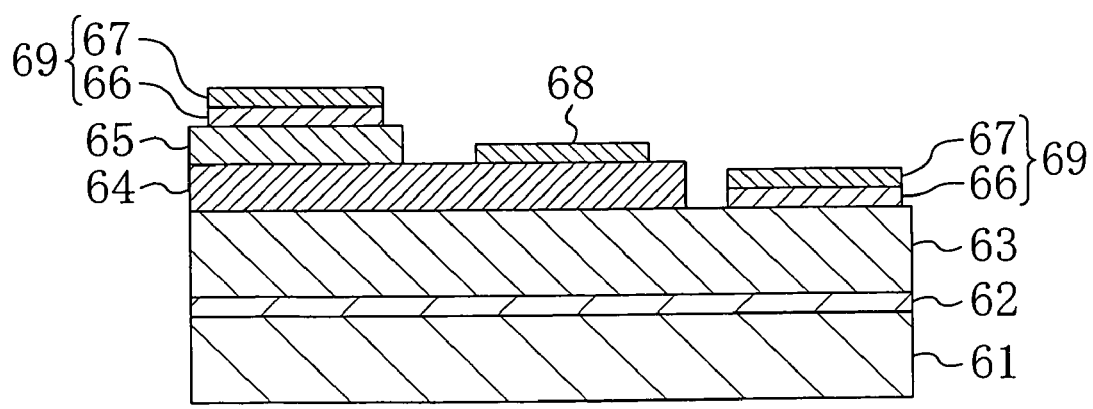
FIG. 6 is a cross-sectional view showing a semiconductor device according to a fourth embodiment of the present invention.

FIG. 6 shows the cross-sectional structure of the semiconductor device of this embodiment. As shown in FIG. 6, a 50-nm-thick buffer layer 62 made of GaN is formed on a substrate 61 made of sapphire, and a 1000-nm-thick collector layer 63 made of n-type GaN is formed on the buffer layer 62. A multilayer electrode 69 having a $LaB_6$ layer 66 as the lower layer and an Al layer 67 as the upper layer is formed, as a collector electrode, on a predetermined region of the collector layer 63.

A 25-nm-thick base layer 64 of p-type InGaN is formed on the top surface of the collector layer 63 except for a region on which the collector electrode is formed. A base electrode 68 of an alloy of Pd and Si is formed on a predetermined region of the top surface of the base layer 64. Furthermore, a 25-nm-thick emitter layer 65 of n-type AlGaN is formed on the top surface of the base layer 64 except for a region on which the base electrode 68 is formed. Another multilayer electrode 69 is formed, as an emitter electrode, on the emitter layer 65 by successively stacking a $LaB_6$ layer 66 and an Al layer 67 in bottom-to-top order.

An example of a method for fabricating a semiconductor device of this embodiment will be described hereinafter. First, a buffer layer 62 of GaN, a collector layer 63 of n-type GaN, a base layer 64 of p-type InGaN, and an emitter layer 65 of n-type AlGaN are successively stacked on a substrate 61 made of sapphire. Subsequently, a predetermined part of the emitter layer 65 is removed by etching, thereby exposing a part of the base layer 64. Furthermore, a predetermined part of the base layer 64 is removed by etching, thereby exposing a part of the collector layer 63. Next, as in the first embodiment, multilayer electrodes 69 are formed on the emitter layer 65 and the collector layer 63, respectively. Then, a base electrode 68 of an alloy of Pd and Si is formed on the base layer 64.

Since in the semiconductor device of this embodiment the multilayer electrodes containing $LaB_6$ is used as the emitter and collector electrodes, this can reduce the ohmic resistance of both of the electrodes, leading to the reduced emitter and collector resistances. This reduces the on-resistance to provide a high-gain HBT having an excellent high-frequency characteristic.

Although in this embodiment each multilayer electrode has the same structure as that of the first embodiment, it may include a metal oxide film as in the second embodiment. Alternatively, other boride compounds may be used instead of $LaB_6$. As long as the semiconductor device of this embodiment serves as a HBT, the thickness of each layer, the composition of each layer, the material of the substrate, and the material of the base electrode, or the like may be changed.

Embodiment 5

A semiconductor device of a fifth embodiment of the present invention will be described hereinafter with reference to FIG. 7. The semiconductor device of this embodiment is a semiconductor light emitting element. The ohmic electrode of the first embodiment is used as an n-side electrode.

Figure 7:
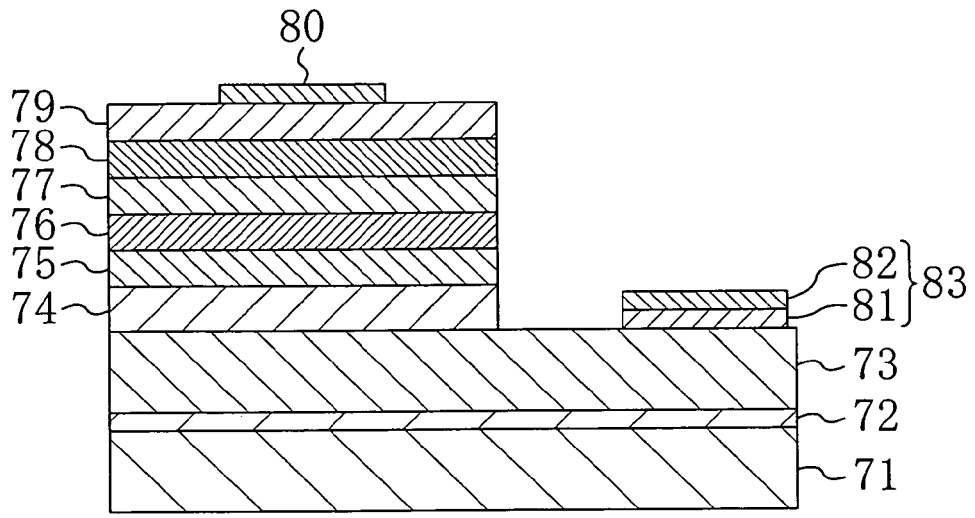
FIG. 7 is a cross-sectional view showing a semiconductor device according to a fifth embodiment of the present invention.
Figure 8A:
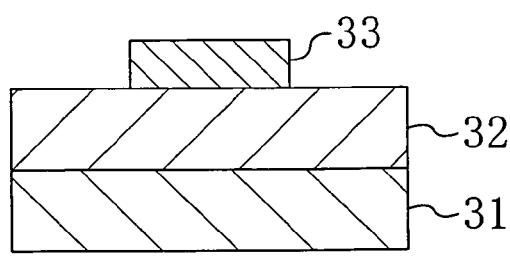
FIGS. 8A and 8B are cross-sectional views showing process steps in a known method for fabricating an ohmic electrode.
Figure 8B:
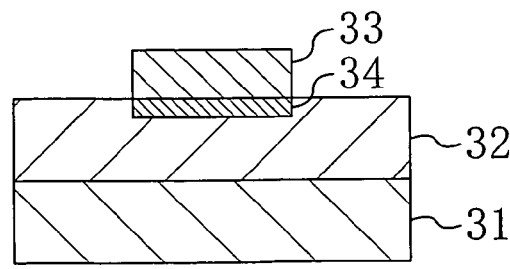

FIG. 7 shows a cross-sectional structure of the semiconductor device of this embodiment. As shown in FIG. 7, a 50-nm-thick buffer layer 72 of GaN is formed on a substrate 71 made of sapphire, and a 100-nm-thick n-type contact layer 73 of GaN is formed on the buffer layer 72. A multilayer electrode 83 having a $LaB_8$ layer 81 as the lower layer and a metallic multilayer film 82 made of aluminum (Al), titanium (Ti) and gold (Au) as the upper layer is formed, as an n-side electrode, on a predetermined region of the top surface of the n-type contact layer 73.

A 500-nm-thick n-type cladding layer 74 of n-type AlGaN is formed on the top surface of the n-type contact layer 73 except for a region on which the n-side electrode is formed. The following layers are stacked on the n-type cladding layer 74 in bottom-to-top order: an optical guide layer 75 made of GaN, a luminescent layer 76 interposed between the optical guide layer 75 and an optical guide layer 77 made of GaN and having a GaN/InGaN quantum well structure, the optical layer 77, a 500-nm-thick p-type cladding layer 78 made of p-type AlGaN, and a 100-nm-thick p-type contact layer 79 made of p-type GaN. Furthermore, a p-side electrode 80 made of platinum is formed on the p-type contact layer 79.

An example of a method for fabricating a semiconductor device of this embodiment will be described hereinafter. First, a buffer layer 72 and an n-type contact layer 73 are stacked on a substrate 71 made of sapphire. Furthermore, an n-type cladding layer 74, an optical guide layer 75, a luminescent layer 76, an optical guide layer 77, a p-type cladding layer 78, and a p-type contact layer 79 are successively deposited on the n-type contact layer 73. Next, the p-type contact layer 79, the p-type cladding layer 78, the optical guide layer 77, the luminescent layer 76, the optical guide layer 75, and the n-type cladding layer 74 are selectively removed by etching, thereby forming a laminated structure with the n-type contact layer 73 exposed. An n-side electrode 83 serving as a multilayer electrode including a $LaB_6$ layer 81 is formed on the exposed n-type contact layer 73 as in the formation of the multilayer electrode of the first embodiment. Furthermore, a p-side electrode 80 made of Pt is formed on the p-type contact layer 79.

In the semiconductor device of this embodiment, $LaB_6$ is used for the n-side electrode. Therefore, the ohmic resistance of the n-side electrode can be reduced. This can reduce the threshold voltage and provide a high-efficiency semiconductor light emitting element.

Although in this embodiment the $LaB_6$ layer is formed directly on the n-type contact layer, a metal oxide film may be formed on the n-type contact layer and then the $LaB_6$ layer may be formed on the metal oxide film as in the second embodiment. Alternatively, other boride compounds may be used instead of $LaB_6$. As long as the semiconductor device of this embodiment serves as a semiconductor light emitting element, the thickness of each layer, the composition of each layer, the material of the substrate, and the material of the p-side electrode, or the like may be changed.

Since in this way the semiconductor device and the method for fabricating the same of the present invention can provide a semiconductor device comprising a low-resistance ohmic electrode and made of a Group III-V nitride semiconductor, they are of great value as a semiconductor device using a Group III-V nitride compound and a method for fabricating the same.

What is claimed is:

1. A semiconductor device comprising:
   a Group III-V nitride semiconductor layer having n-type conductivity;
   at least one ohmic electrode formed on the Group III-V nitride semiconductor layer; and
   a metal oxide film formed between the Group III-V nitride semiconductor layer and the ohmic electrode,
   wherein the ohmic electrode is made of a conductive material containing a metal boride.

2. The semiconductor device of claim 1, wherein the metal boride is one selected from the group consisting of $HfB_2$, $ZrB_2$, $LaB_6$, $CeB_6$, $YB_4$, and $GdB_4$, or a laminate of at least two selected from the group.

3. The semiconductor device of claim 1, wherein the metal oxide film is formed of an oxide of one selected from the group consisting of magnesium, calcium, barium, and strontium, or an oxide of an alloy made of at least two selected from the group.

4. The semiconductor device of claim 3, wherein the metal oxide film has a thickness of 1 nm through 10 nm both inclusive.

5. The semiconductor device of claim 1, wherein:
   a heterojunction interface is formed below the Group III-V nitride semiconductor layer having n-type conductivity;
   the ohmic electrode is composed of two electrodes formed with a space interposed therebetween;
   the two electrodes are source/drain electrodes;
   a gate electrode is formed between the source and drain electrodes, said gate electrode controlling a current flowing between the source and drain electrodes; and
   the semiconductor device serves as a field-effect transistor.

6. The semiconductor device of claim 1, wherein:
   the Group III-V nitride semiconductor layer having n-type conductivity is composed of two layers that are a collector layer and an emitter layer;
   a base layer is formed between the collector layer and the emitter layer, said base layer being a Group III-V nitride semiconductor layer having p-type conductivity, and an NPN junction is formed of the collector layer, the base layer and the emitter layer;
   the ohmic electrode formed on a predetermined region of the top surface of the collector layer is a collector electrode;
   the ohmic electrode formed on a predetermined region of the top surface of the emitter layer is an emitter electrode; and
   the semiconductor device serves as a bipolar transistor.

7. The semiconductor device of claim 1, wherein
   the Group III-V nitride semiconductor layer having n-type conductivity is an n-type contact layer,
   the ohmic electrode is an n-side electrode, and
   the semiconductor device further comprises an n-type cladding layer formed in contact with the n-type contact layer, an active layer, p-type cladding layer and p-type contact layer successively formed on the n-type cladding layer, and a p-side electrode formed in contact with the p-type contact layer and serves as a semiconductor light emitting element.

* * * * *